United States Patent
Hamada

(10) Patent No.: US 11,003,070 B2
(45) Date of Patent: May 11, 2021

(54) PELLICLE FRAME, PELLICLE, AND METHOD OF PRODUCING PELLICLE FRAME

(71) Applicant: Shin-Etsu Chemical Co., Ltd., Tokyo (JP)

(72) Inventor: Yuichi Hamada, Takasaki (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 229 days.

(21) Appl. No.: 16/371,478

(22) Filed: Apr. 1, 2019

(65) Prior Publication Data

US 2019/0302608 A1    Oct. 3, 2019

(30) Foreign Application Priority Data

Apr. 3, 2018   (JP) ............................. JP2018-071568

(51) Int. Cl.
*G03F 1/64*   (2012.01)
(52) U.S. Cl.
CPC ..................................... *G03F 1/64* (2013.01)
(58) Field of Classification Search
CPC ....................................................... G03F 1/64
See application file for complete search history.

(56) References Cited

U.S. PATENT DOCUMENTS

| | | | |
|---|---|---|---|
| 2010/0273097 A1 | 10/2010 | Shirasaki | |
| 2010/0330467 A1* | 12/2010 | Shirasaki | G03F 1/64 430/5 |
| 2012/0122025 A1* | 5/2012 | Murakami | G03F 1/64 430/5 |
| 2014/0307237 A1* | 10/2014 | Sekihara | C23C 28/00 355/30 |
| 2018/0239242 A1* | 8/2018 | Kohmura | G03F 1/64 |

FOREIGN PATENT DOCUMENTS

| | | |
|---|---|---|
| JP | 2007-333910 | 12/2007 |
| JP | 2010-256609 | 11/2010 |
| JP | 2012-93517 | 5/2012 |
| JP | 2013-7762 | 1/2013 |
| JP | 2013-20235 | 1/2013 |
| JP | 2014-109748 | 6/2014 |
| JP | 2014-206661 | 10/2014 |
| JP | 2018-28859 | 2/2018 |
| WO | WO 2015/059783 A1 | 4/2015 |
| WO | WO 2018/012323 A1 | 4/2015 |
| WO | WO 2017/030109 A1 | 2/2017 |
| WO | WO 20181055995 A1 | 3/2018 |

OTHER PUBLICATIONS

Extended European Search Report dated Sep. 9, 2019, in Patent Application No. 19166511.6, 7 pages.

* cited by examiner

*Primary Examiner* — Stewart A Fraser
(74) *Attorney, Agent, or Firm* — Oblon, McClelland, Maier & Neustadt, L.L.P.

(57) ABSTRACT

The present invention relates to a pellicle frame including a frame base, a black anodized film formed on a surface of the frame base and having a thickness of 2.0 to 7.5 μm, and a transparent polymer electrodeposition coating film formed on the anodized film, and a production method thereof; and to a pellicle including the pellicle frame and a pellicle film provided on one end face of the pellicle frame.

6 Claims, 1 Drawing Sheet

[Fig. 1]
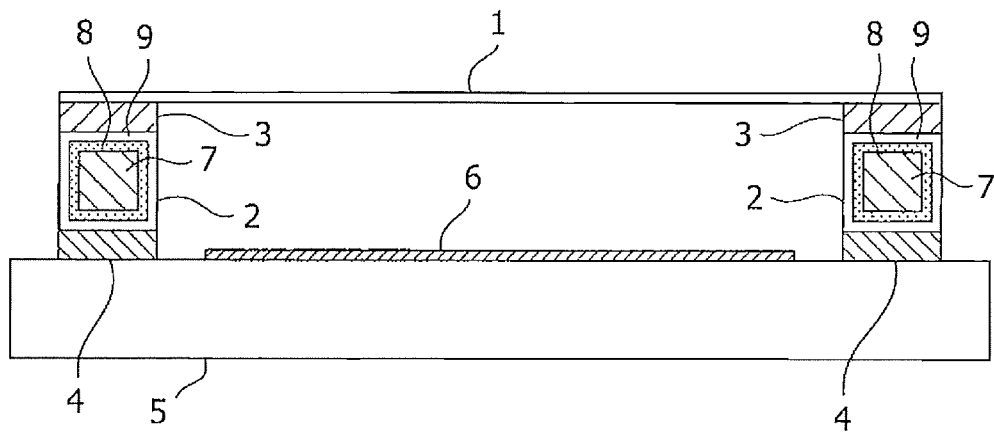
[Fig. 2]
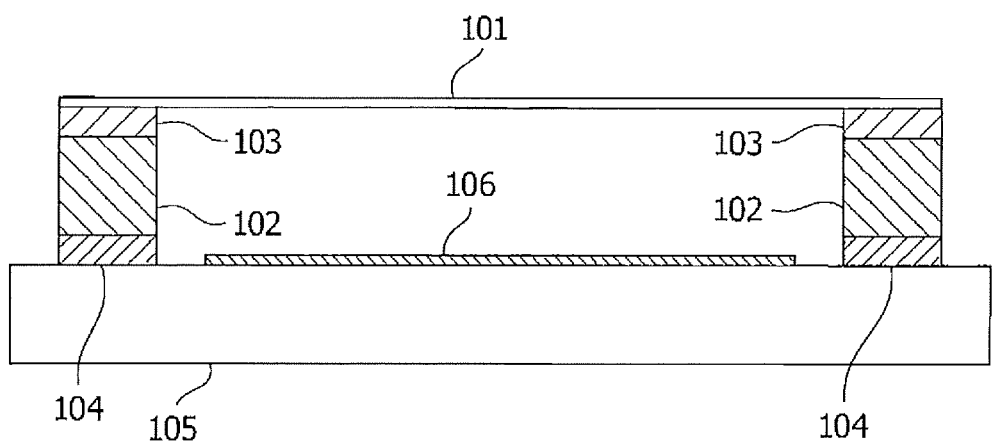

PELLICLE FRAME, PELLICLE, AND METHOD OF PRODUCING PELLICLE FRAME

FIELD OF THE INVENTION

The present invention relates to a pellicle for lithography, which is used as a dust fender of a photomask in the manufacture of semiconductor devices, liquid crystal displays, and the like, a pellicle frame constituting the same, and a method of producing a pellicle frame.

BACKGROUND OF THE INVENTION

In the manufacture of semiconductors, such as LSI and VLSI, or liquid crystal displays and the like, there is adopted a photolithography technique of irradiating a semiconductor wafer or a liquid crystal original plate with light, to form a pattern.

In this photography process, in the case where a dust adheres to a photomask (exposure original plate), the dust likely absorbs the light or bends the light. As a result, there was encountered a problem of impaired dimensions, quality, and appearance, due to deformation of transferred patterns, roughened edges, black stains on the base, or the like. For this reason, these operations are usually performed in a clean room, but it is still difficult to keep the photomask completely clean even in the clean room. In consequence, for the purpose of defending the dust, it is typically performed to attach a pellicle which permits exposure light to pass well to a surface of the photomask. According to this, the dust does not directly adhere to the surface of the photomask but adheres onto a pellicle film. For that reason, if the exposure light is focused on the pattern on the photomask at the time of exposure, the dust on the pellicle film does not partake in the transfer.

A configuration of a typical pellicle is shown in FIG. 2. In the pellicle, a pellicle film 101 which permits exposure light to pass well is bonded to an upper end face of a pellicle frame 102 via an adhesive 103 in a slack-free manner, and a pressure sensitive adhesive layer 104 for attaching the pellicle to a photomask 105 is formed on a lower end face of the pellicle frame 102. In addition, a separator (not shown) for protecting the pressure sensitive adhesive layer 104 may be provided on a lower end face of the pressure sensitive adhesive layer 104 in a detachable manner. Such a pellicle is fixed so as to cover a pattern region 106 formed on a surface of the photomask. In consequence, this pattern region 106 is isolated from the outside by the pellicle, and the matter that the dust adheres onto the photomask is prevented from occurring.

In recent years, the design rule of LSI is increasingly densified to sub-quarter microns. Following this, the particle size subjective to suppression of contamination has been further miniaturized. In addition, the wavelength of an exposure light source has also been shortened, and fine particles which likely cause a haze due to exposure are liable to be generated.

This is because in view of the matter that the energy of light becomes large due to shorter wavelength of exposure, a gaseous substance existing in an exposure atmosphere reacts to produce a reaction product on a mask substrate. For example, an acid, such as sulfuric acid, nitric acid, and an organic acid, is taken into an anodized film of an aluminum alloy surface to be used for a pellicle frame. This is detached from the anodized film of the frame surface in an exposure environment and stays in a space between the pellicle and the mask. When a short-wavelength ultraviolet ray is applied in this state at the time of exposure, a sulfuric acid compound, for example, ammonium sulfate, is produced.

For that reason, a conventional frame having been subjected to an alumite treatment (anodizing) has become avoided due to contamination of sulfate ions. Then, for example, PTL 1 proposes a pellicle coated with a polymer as a frame which is free from elution of sulfate ions. This patent literature discloses a matte black electrodeposition coating film prepared by using a matte coating material colored with a black pigment.

In addition, PTL 2 discloses a pellicle frame in which a pure aluminum film is formed on a surface of a frame base made of an aluminum alloy and further subjected to anodizing and black dyeing, followed by performing electrodeposition coating to form a transparent acrylic resin film. The foregoing pure aluminum film is one which covers crystalline particles of the aluminum alloy surface, which are a cause of a light reflective point (defect), which may be mistaken for a foreign material stuck on the pellicle frame surface, thereby improving the appearance quality or reliability of the pellicle.

CITATION LIST

Patent Literature

PTL 1: JP 2007-333910 A
PTL 2: JP 2014-206661 A

SUMMARY OF THE INVENTION

In the exposure step of photolithography, exposure light is typically set so as not to hit a pellicle frame. However, light reflected by, for example, edges of a pattern, or a part of diffracted light may hit as stray light the inside face of a pellicle frame. In the case where such stray light hits the inside face of a pellicle frame coated with a polymer as described in PTL 1, there is a concern that the polymer coating layer is etched, and pigment fine particles or other particles dispersed therein fall off.

The stray light hitting the inside face of a pellicle frame is thought to be up to about 1.5% of the ArF laser intensity irradiated to the pattern region of a photomask. The current pellicle film for ArF is required to have a light resistance of about 100,000 J, so that the inside face of a pellicle frame is correspondingly required to have a light resistance of about 1,500 J.

On the other hand, in the case of forming a coating film on a frame base having an anodized film formed thereon through electrodeposition, it is difficult to form a uniform coating film, and a yield is occasionally remarkably lowered. It is thought that this is caused due to the matter that the anodized film is non-electroconductive.

In addition, in the case where the heterogeneity of a thickness of the electrodeposition coating film is relatively slight, it is difficult to detect the heterogeneous portion, and it becomes difficult to detect a failure through appearance inspection. In this case, in a place where the film thickness is thin, it is damaged by the exposure light, and the anodized film is exposed, thereby possibly causing the generation of a haze.

In the light of the above, an object of the present invention is to provide a pellicle frame in which in the exposure step of photolithography, even in the case where a stray light hits the inside face of a pellicle frame, a photomask is not contaminated by detachment of an acid, or the like, and the generation of a surface defect to be mistaken for a foreign material is suppressed, thereby making it easy to undergo an appearance inspection; and a pellicle containing the same. In addition, another object of the present invention is to provide a method of producing this pellicle frame in a good yield.

In order to solve the aforementioned problems, the present inventor made extensive and intensive investigations. As a result, it has been found that by regulating an anodized film to a specified range in a relatively small thickness and further providing a transparent polymer electrodeposition coating film on the anodized film, the foregoing problems can be solved, thereby leading to accomplishment of the present invention. Specifically, the present invention is as follows.

[1] A pellicle frame including a frame base, a black anodized film formed on a surface of the frame base and having a thickness of 2.0 to 7.5 µm, and a transparent polymer electrodeposition coating film formed on the anodized film.
[2] The pellicle frame as set forth in [1], wherein the transparent polymer electrodeposition coating film does not contain a heterogeneous component existing heterogeneously relative to the transparent polymer electrodeposition coating film.
[3] The pellicle frame as set forth in [1] or [2], wherein the transparent polymer electrodeposition coating film does not contain a dye.
[4] The pellicle frame as set forth in any of [1] to [3], wherein a visible light transmittance of the transparent polymer electrodeposition coating film is more than 50%.
[5] A pellicle including the pellicle frame as set forth in any of [1] to [4] and a pellicle film provided on one end face of the pellicle frame.
[6] A method of producing a pellicle frame, including: a step of forming an anodized film having a thickness of 2.0 to 7.5 µm on a surface of a frame base; a step of coloring the anodized film black; and a step of forming a transparent polymer electrodeposition coating film on the anodized film, in this order.

In accordance with the present invention, it is possible to provide a pellicle frame in which in the exposure step of photolithography, even in the case where a stray light hits the inside face of a pellicle frame, a photomask is not contaminated by detachment of an acid, or the like, and the generation of a surface defect to be mistaken for a foreign material is suppressed, thereby making it easy to undergo an appearance inspection; and a pellicle containing the same. In addition, it is possible to provide a method of producing this pellicle frame in a good yield.

Furthermore, as compared with a conventional pellicle frame coated with a polymer, in accordance with the present invention, it is possible to increase an irradiation amount of exposure light, or to increase energy of exposure light to be used.

BRIEF DESCRIPTION OF THE DRAWINGS

FIG. 1 is a schematic cross-sectional view of a pellicle according to an embodiment of the present invention.
FIG. 2 is a schematic cross-sectional view showing a typical configuration of a conventional pellicle.

DETAILED DESCRIPTION OF THE INVENTION

Embodiments of the present invention are hereunder described in detail, but it should be construed that the present invention is not limited thereto.

[1] Pellicle Frame

The pellicle frame according to the present embodiment includes a frame base, a black anodized film formed on a surface of the frame base and having a thickness of 2.0 to 7.5 µm, and a transparent polymer electrodeposition coating film formed on the anodized film.

(Frame Base)

As the frame base of the pellicle frame, materials capable of forming an anodized film can be used. Above all, aluminum and aluminum alloys are preferably used from the standpoint of strength, rigidity, lightweight, processability, cost, and others. Examples of the aluminum alloy include JIS A7075, JIS A6061, and JIS A5052.

(Anodized Film)

The anodized film is a film obtained by subjecting a surface of the frame base to an electrolysis treatment, and especially, an alumite film is especially referred to in the present invention.

A thickness of the anodized film is 2.0 to 7.5 µm, preferably 2.0 to 7.0 µm, and more preferably 3.0 to 5.0 µm. Although a thickness of an anodized film in a typical pellicle frame is about 10 µm, in the present embodiment, its film thickness is made small. According to this, since the film resistance does not become excessively high, it becomes possible to perform polymer electrodeposition coating in a uniform film thickness in a post-process. In particular, by regulating the thickness of the anodized film to 7.5 µm or less, color unevenness of the pellicle frame, namely a difference in black coloring to be caused due to heterogeneity of the film thickness of a transparent polymer electrodeposition coating film, can be suppressed. In addition, surface abnormality of the pellicle frame, namely the generation of a defect to be caused due to a spot where a transparent polymer electrodeposition coating film is unformed, can be suppressed. As a result, the generation of a surface defect to be mistaken for a foreign material is suppressed, whereby it becomes easy to undergo an appearance inspection. In addition, by regulating the thickness of the anodized film to 2 µm or more, a black pellicle frame that is advantageous in the appearance inspection for inspecting the presence or absence of a foreign material is obtained.

The anodized film according to the present embodiment is blackened. In view of the matter that the anodized film is blackened, a pellicle that makes it easy to detect a foreign material even in the foreign material inspection can be obtained. The wording "blackened" refers to the matter that the anodized film is blackened to an extent that an L value of the pellicle frame is 35 or less. In order to reveal the blackening, for example, a treatment of coloring the anodized film black may be performed in a coloring step as mentioned later.

(Transparent Polymer Electrodeposition Coating Film)

The transparent polymer electrodeposition coating film is a transparent polymer coating film formed through electrodeposition. The electrodeposition coating film may be any of a cationic electrodeposition coating film and an anionic electrodeposition coating film.

Examples of the resin to be used for the transparent polymer electrodeposition coating film are various and include an epoxy resin, an acrylic resin, an aminoacrylic resin, and a polyester resin. Although the resin may be selected from known resins in consideration of heat resistance, light resistance, strength, and so on, the resin is preferably selected such that a visible light transmittance of the transparent polymer electrodeposition coating film is more than 50%.

Although the transparent polymer electrodeposition coating film may be a single layer, two or more layers thereof may be laminated. In the case of a laminated layer, all of the laminated transparent polymer electrodeposition coating films are preferably configured so as to contain the same resin. According to this, a defect, such as detachment of the transparent polymer electrodeposition coating film from an interface, is hardly caused.

Preferably, the transparent polymer electrodeposition coating film does not contain a heterogeneous component existing heterogeneously relative to the foregoing transparent polymer electrodeposition coating film, and a dye. The heterogeneous component is a component existing heterogeneously relative to the transparent polymer electrodeposition coating film (especially, a granular heterogeneous component) and is one which generates a glare or the like in the appearance inspection of the pellicle frame. The dye may also generate a glare or the like, and therefore, it is preferred that the dye is not contained. Namely, the transparent polymer electrodeposition coating film is preferably constituted of only a resin component.

The visible light transmittance of the transparent polymer electrodeposition coating film is preferably more than 50%, and more preferably 80% or more. The visible light transmittance can be measured with a commercially available spectrophotometer.

When the transparent polymer electrodeposition coating film transmits a visible light ray relatively well, a color tone of the base of the transparent polymer electrodeposition coating film can be reflected to a color tone of the pellicle frame. At this time, when the anodized film that is the base of the transparent polymer electrodeposition coating film is black, the pellicle frame becomes black, too. When the color tone of the pellicle frame is black, an advantageous pellicle that is easy to detect a foreign material in the appearance inspection for inspecting the presence or absence of a foreign material, too can be obtained.

According to such a constitution, the L value of the pellicle frame is regulated to preferably 35 or less, and more preferably 30 or less. The term "L value" as referred to herein is an index expressing brightness of a color when a black body (an idealized physical body that absorbs all wavelengths incident to the surface without reflection or transmission) is defined as 0, whereas a conflicting white color is defined as 100. When the L value is more than 35, it becomes difficult to detect a foreign material in the appearance inspection, too, and workability is worsened.

Although a thickness of the transparent polymer electrodeposition coating film is not limited, it is preferably 2 μm or more, and more preferably 2.0 to 10.0 μm in consideration of the energy of an ArF laser light which is typically used as the exposure light.

The foregoing pellicle frame corresponds to the shape of a photomask to which the pellicle is attached, and typically has a quadrangular frame shape, such as a rectangular frame shape or a square frame shape.

The pellicle frame may be provided with a pressure-adjusting hole. By providing a pressure-adjustment hole, a difference in atmospheric pressure between the inside and the outside of a closed space defined by a pellicle and a photomask is eliminated, so that it is able to prevent a pellicle film from swelling or deflating.

A dust filter is preferably attached to the pressure-adjusting hole. The dust filter can prevent a foreign material from entering through the pressure-adjusting hole into the closed space defined by a pellicle and a photomask.

Examples of the material of the dust filter include a resin, a metal, and a ceramic. In addition, a chemical filter is also preferably provided to the outer side of the dust filter to adsorb or decompose a chemical substance in the environment.

The inner circumferential surface of the pellicle frame or the inner wall surface of the pressure-adjusting hole may be coated with a pressure sensitive adhesive to capture a foreign material existing in the closed space defined by a pellicle and a photomask.

The pellicle frame may be further provided with a concave or a convex, such as a hole or a groove for inserting a handling jig, as the need arises.

[2] Production Method of Pellicle Frame

A production method of a pellicle frame according to the present invention includes: a step of forming an anodized film having a thickness of 2.0 to 7.5 μm on a surface of a frame base (anodized film forming step); a step of coloring the anodized film black (coloring step); and a step of forming a transparent polymer electrodeposition coating film on the anodized film (transparent polymer electrodeposition coating film forming step), in this order.

(Anodized Film Forming Step)

In the anodized film forming step, an anodized film is formed on a frame base; however, before the formation, the frame base is preferably roughened by sandblasting or chemical polishing. A conventionally known method can be adopted for the surface roughening method of a frame base. For example, a method in which a surface of a frame base of an aluminum alloy is subjected to a blast treatment with stainless steel, Carborundum (silicon carbide), glass beads, or the like, or subjected to chemical polishing with an alkaline solution, such as NaOH, can be adopted.

After the aforementioned arbitrary roughening, an anodized film is formed on a surface of a frame base. The anodized film can be formed by a known method. The anodized film of aluminum or an aluminum alloy (alumite) is typically formed by a sulfuric acid method, a boric acid method, a chromic acid method, or the like. In a typical pellicle frame, alumite sulfate by a sulfuric acid method is frequently adopted.

In particular, in the case of forming alumite sulfate by a sulfuric acid method, the film thickness can be favorably regulated to a range of 2.0 to 7.5 μm by regulating a condition, such as a treatment time. In addition, by regulating the film thickness to a range of 2.0 to 7.5 μm, the generation of a surface defect to be mistaken for a foreign material is suppressed, whereby it becomes easy to undergo an appearance inspection; it does not recognize a product that is originally not defective, as a defective product; and the yield of a pellicle can be improved.

(Coloring Step)

In the coloring step, a blackening treatment for coloring the anodized film black is performed. When the pellicle frame is black, in the appearance inspection of a pellicle frame by irradiating a pellicle frame with light and inspecting the presence or absence of a dust due to reflection of light, the stray light is suppressed, whereby the dust is readily recognized.

For the blackening treatment, a known method can be adopted, and examples thereof include a treatment with a black dye and an electrolytic deposition treatment (secondary electrolysis). Of these, a dyeing treatment with a black dye is preferred, and a dyeing treatment with an organic black dye is more preferred. Typically, the organic dye is considered to have a low content of an acid component, and above all, an organic dye having low contents of sulfuric acid, acetic acid, and formic acid is preferably used. Examples of such an organic dye include commercially available products, such as "TAC411", "TAC413", "TAC415", and "TAC420" (all of which are manufactured by Okuno Chemical Industries Co., Ltd.). The dyeing treatment may be performed in such a manner that a frame material after the anodizing treatment is immersed in a dye solution having been regulated to a predetermined concentration, followed by performing the treatment under a treatment condition at a treatment temperature of 40 to 60° C. and a pH of 5 to 6 for about 10 minutes.

After the blackening treatment, the anodized film is preferably subjected to a sealing treatment. The sealing treatment is not particularly limited, and a known method using a water vapor or a sealing bath can be adopted. From the viewpoint of sealing off an acid component, a sealing treatment with a water vapor is preferred. As for the condition of the sealing treatment with a water vapor, for example, the treatment may be performed at a temperature of 105 to 130° C., a relative humidity of 90 to 100% (R.H.), and a pressure of 0.4 to 2.0 kg/cm$^2$G for about 12 to 60 minutes. In addition, after the sealing treatment, for example, washing with pure water is preferably performed.

(Transparent Polymer Electrodeposition Coating Film Forming Step)

In the transparent polymer electrodeposition coating film forming step, a transparent polymer electrodeposition coating film is formed on the anodized film having been subjected to the aforementioned treatment. By forming a transparent polymer electrodeposition coating film, a color tone of the black pellicle frame can be reflected, and it is readily detected in the appearance inspection for inspecting the presence or absence of a foreign material.

Examples of the resin to be used for the transparent polymer electrodeposition coating film are various and include an epoxy resin, an acrylic resin, an aminoacrylic resin, and a polyester resin. The resin may be selected from known resins in consideration of heat resistance, light resistance, strength, and so on.

Since it is preferred that the transparent polymer electrodeposition coating film does not contain a dye and a heterogeneous component, such as a pigment and a filler, it is preferred to design the materials so as not to contain those components. According to this, a glare to be caused due to particles, namely the matter that the dye or the heterogeneous component becomes a foreign material to cause a light reflective point can be prevented from occurring.

The transparent polymer electrodeposition coating film is formed through electrodeposition coating in view of advantages, such as uniformity of film thickness, film smoothness, or other advantages.

For the electrodeposition coating, any of a thermosetting resin and an ultraviolet curable resin can be used. In addition, in each step, either anionic electrodeposition coating or cationic electrodeposition coating can be adopted. The anionic electrodeposition coating, in which a material to be coated is used as a positive electrode, is preferred because the amount of a generated gas is small, so that a possibility of causing a fault, such as a pinhole, in a coating film is low.

A coating apparatus and an electrodeposition coating material to be used for the electrodeposition coating are commercially available from some companies. Examples of an electrodeposition coating material include "ELECOAT" which is commercially available as a trade name from Shimizu Co., Ltd.

[3] Pellicle

The pellicle according to the present embodiment includes a pellicle frame and a pellicle film provided on one end face of the pellicle frame.

Although the material of the pellicle film is not particularly limited, a material having a high transmittance at the wavelength of exposure light and having high light resistance is preferred. For example, an amorphous fluoropolymer which is conventionally used for excimer laser and the like are used. Examples of the amorphous fluoropolymer include CYTOP (a trade name, manufactured by Asahi Glass Co., Ltd.), Teflon (a registered trademark), and AF (a trade name, manufactured by DuPont). Such a polymer may be optionally dissolved in a solvent at the time of producing a pellicle film and then used, and for example, may be properly dissolved in a fluorine-based solvent or the like. In addition, in the case of using an EUV light as the exposure light source, an ultrathin silicon film having a film thickness of 1 μm or less or a graphene film can be used.

On the occasion of bonding the pellicle film to the pellicle frame, the pellicle frame is subjected to application of a good solvent for the pellicle film and air-dried, and the pellicle film is then bonded to the pellicle frame. Alternatively, an acrylic resin adhesive, an epoxy resin adhesive, a silicone resin adhesive, a fluorine-containing silicone adhesive, or the like may be used to bond the pellicle film to the pellicle frame.

The pellicle further includes a device for installation on a photomask, and a pressure sensitive adhesive layer is typically provided on the other end face of the pellicle frame. The pressure sensitive adhesive layer is formed over the entire circumference on a lower end face of the pellicle frame and formed in a width equal to or less than that of the pellicle frame. A thickness of the pressure sensitive adhesive layer is preferably 0.2 to 0.5 mm.

As for the material of the pressure sensitive adhesive layer, a known material, such as a rubber-based pressure sensitive adhesive, a urethane-based pressure sensitive adhesive, an acrylic pressure sensitive adhesive, an SEBS pressure sensitive adhesive, an SEPS pressure sensitive adhesive, and a silicone pressure sensitive adhesive, can be used. In the case of using an EUV light as the exposure light source, a silicone pressure sensitive adhesive that is excellent light resistance and the like is preferably used. In addition, a pressure sensitive adhesive which is less in outgassing possibly causing a haze is preferred.

Typically, a separator provided on the lower end face of the pressure sensitive adhesive layer can also be omitted by devising a pellicle-storing container or the like. In the case where a separator is provided, a film made of polyethylene terephthalate (PET), polytetrafluoroethylene (PTFE), a tetrafluoroethylene-perfluoroalkyl vinyl ether copolymer (PFA), polyethylene (PE), polycarbonate (PC), polyvinyl chloride (PVC), polypropylene (PP), or the like can be used as the separator. In addition, a release agent, such as a silicone-based release agent and a fluorine-based release agent, may be optionally applied to the surface of a separator.

A schematic cross-sectional view of a specific example of the pellicle according to the present embodiment is shown in FIG. 1. First, a pellicle frame 2 includes a frame base 7, a black anodized film 8 formed on the frame base 7, and a transparent polymer electrodeposition coating film 9 formed on the anodized film 8. A pellicle film 1 which permits exposure light to pass well is bonded to an upper end face of the pellicle frame 2 via an adhesive 3 in a slack-free manner, and a pressure sensitive adhesive layer 4 for attaching the pellicle to a photomask 5 is formed on a lower end face of the pellicle frame 2. In addition, a separator (not shown) for protecting the pressure sensitive adhesive layer 4 may be provided on a lower end face of the pressure sensitive adhesive layer 4 in a detachable manner. Such a pellicle is fixed so as to cover a pattern region 6 formed on a surface of the photomask. In consequence, this pattern region 6 is isolated from the outside by the pellicle, and the matter that the dust adheres onto the photomask is prevented from occurring.

EXAMPLES

The present invention is hereunder described by reference to Examples, but it should be construed that the present invention is not limited to these Examples.

Example 1

First, an aluminum-made frame having frame external dimensions of 149 mm×115 mm×4.5 mm and a frame thickness of 2 mm was prepared as a frame base of a pellicle. A surface of this frame base was subjected to sandblasting. The sandblasting was performed by blowing glass beads (30 to 100 μm) with a sandblasting apparatus at a discharge pressure of 1.5 kg for 10 minutes.

Subsequently, an anodized film (alumite) having a film thickness of 7.0 μm was formed on the frame base by adopting a sulfuric acid method. An electrolysis bath used for the formation of the anodized film was 15% by mass sulfuric acid, and the method was performed at an electrolysis voltage of 20 V and a quantity of electricity of 15 c/cm$^2$ for a treatment time of 20 minutes.

As for this anodized film, the frame material after anodizing was immersed in a dye solution of "TAC420" (manufactured by Okuno Chemical Industries Co., Ltd) having been regulated to a predetermined concentration and dyed under a treatment condition at a treatment temperature of 40 to 60° C. and a pH of 5 to 6 for about 10 minutes, to color the anodized film black, followed by performing a sealing treatment at a temperature of 110° C., a relative humidity of 90 to 100% (R.H.), and a pressure of 1.0 kg/cm$^2$G for 15 minutes.

Subsequently, after washing the frame base with pure water, the frame base was subjected to anionic electrodeposition coating (at a temperature of 25° C. and a voltage of 140 V for 5 minutes) by using an electrodeposition coating material (ELECOAT AM, manufactured by Shimizu Co., Ltd.) not containing a pigment and fine particles, such as a filler. According to this, a transparent polymer electrodeposition coating film having a thickness of 9 μm was formed on the anodized film. The frame which had been subjected to electrodeposition coating was heated under a condition at 200° C. for 60 minutes to cure the transparent polymer electrodeposition coating film, thereby producing a pellicle frame. In addition, with respect to a separately produced transparent polymer electrodeposition coating film (thickness: 10 μm), a transmittance in a visible light region was measured with UV-1850, manufactured by Shimadzu Corporation and found to be 82%.

An L value of the thus obtained pellicle frame was measured with a spectrocolorimeter (NF-555, manufactured by Nippon Denshoku Industries Co., Ltd.) and found to be 23.

Similarly, ten pellicle frames were produced and subjected to appearance inspection. As a result, in all of the frames, neither color unevenness observed in the case where a transparent polymer electrodeposition coating film is heterogeneous nor surface abnormality observed in the case where a transparent polymer electrodeposition coating film is not formed was perceived.

On one end face of the pellicle frame in which neither color unevenness nor face abnormality was perceived, a pellicle film (a pellicle film having a film thickness of 0.28 μm, which was produced with CYTOP S Type, manufactured by Asahi Glass Co., Ltd.) was bonded via an adhesive (CYTOP A Type, manufactured by Asahi Glass Co., Ltd.) in a slack-free manner, and on the other end face, a pressure sensitive adhesive layer was formed of a silicone pressure sensitive adhesive (X-40-3264, manufactured by Shin-Etsu Chemical Co., Ltd.), thereby accomplishing a pellicle.

The inside face of the frame of the formed pellicle was irradiated with an ArF laser set to 5 mJ/cm$^2$/pulse and 500 Hz. After elapsing 30 minutes after carrying out the irradiation with an ArF laser (integrated energy: 4,500 J), the state of the inside face of the frame was inspected in a dark room upon irradiation with a light-condensing lamp. As a result, a glare to be caused due to particles was not observed.

Using another pellicle produced in the same manner, an ion analysis was performed. The pellicle was immersed in 100 mL of pure water at 90° C. for 3 hours, and then, the water in which the pellicle was immersed was subjected to an ion analysis. As a result, a sulfate ion was not detected.

Example 2

A pellicle frame was produced in the same manner as in Example 1, except that the anodized film (alumite) was formed so as to have a film thickness of 2.0 μm. The anodized film was subjected to coloring; however, the color was slightly pale, and the pellicle frame had an L value of 32. In addition, a transmittance of the transparent polymer electrodeposition coating film in a visible light region as measured in the same manner as in Example 1 was 83%.

Similarly, ten pellicle frames were produced and subjected to appearance inspection. As a result, in all of the frames, neither color unevenness observed in the case where a transparent polymer electrodeposition coating film is heterogeneous nor surface abnormality observed in the case where a transparent polymer electrodeposition coating film is not formed was perceived.

The inside face of the frame of a pellicle produced in the same manner as in Example 1 was irradiated with an ArF laser set to 5 mJ/cm$^2$/pulse and 500 Hz. After elapsing 30 minutes after carrying out the irradiation with an ArF laser (integrated energy: 4,500 J), the state of the inside face of the frame was inspected in a dark room upon irradiation with a light-condensing lamp. As a result, a glare to be caused due to particles was not observed.

As compared with Example 1, a time of 1.2 times was required for the inspection of the ten pellicle frames. When the required time is within 1.5 times as compared with Example 1, it may be said that the productivity is favorable.

Using another pellicle produced in the same manner, an ion analysis was performed. The pellicle was immersed in 100 mL of pure water at 90° C. for 3 hours, and then, the water in which the pellicle was immersed was subjected to an ion analysis. As a result, a sulfate ion was not detected.

Example 3

A pellicle frame was produced in the same manner as in Example 1, except that the anodized film (alumite) was formed so as to have a film thickness of 3.0 μm. The anodized film was colored black, and the pellicle frame had an L value of 29. In addition, a transmittance of the transparent polymer electrodeposition coating film in a visible light region as measured in the same manner as in Example 1 was 82%.

Similarly, ten pellicle frames were produced and subjected to appearance inspection. As a result, in all of the frames, neither color unevenness observed in the case where a transparent polymer electrodeposition coating film is heterogeneous nor surface abnormality observed in the case where a transparent polymer electrodeposition coating film is not formed was perceived.

The inside face of the frame of a pellicle produced in the same manner as in Example 1 was irradiated with an ArF laser set to 5 mJ/cm$^2$/pulse and 500 Hz. After elapsing 30 minutes after carrying out the irradiation with an ArF laser (integrated energy: 4,500 J), the state of the inside face of the frame was inspected in a dark room upon irradiation with a light-condensing lamp. As a result, a glare to be caused due to particles was not observed.

Using another pellicle produced in the same manner, an ion analysis was performed. The pellicle was immersed in 100 mL of pure water at 90° C. for 3 hours, and then, the water in which the pellicle was immersed was subjected to an ion analysis. As a result, a sulfate ion was not detected.

Example 4

A pellicle frame was produced in the same manner as in Example 1, except that the anodized film (alumite) was formed so as to have a film thickness of 5.0 µm. The anodized film was colored black, and the pellicle frame had an L value of 26. In addition, a transmittance of the transparent polymer electrodeposition coating film in a visible light region as measured in the same manner as in Example 1 was 82%.

Similarly, ten pellicle frames were produced and subjected to appearance inspection. As a result, in all of the frames, neither color unevenness observed in the case where a transparent polymer electrodeposition coating film is heterogeneous nor surface abnormality observed in the case where a transparent polymer electrodeposition coating film is not formed was perceived.

The inside face of the frame of a pellicle produced in the same manner as in Example 1 was irradiated with an ArF laser set to 5 mJ/cm$^2$/pulse and 500 Hz. After elapsing 30 minutes after carrying out the irradiation with an ArF laser (integrated energy: 4,500 J), the state of the inside face of the frame was inspected in a dark room upon irradiation with a light-condensing lamp. As a result, a glare to be caused due to particles was not observed.

Using another pellicle produced in the same manner, an ion analysis was performed. The pellicle was immersed in 100 mL of pure water at 90° C. for 3 hours, and then, the water in which the pellicle was immersed was subjected to an ion analysis. As a result, a sulfate ion was not detected.

Comparative Example 1

A pellicle frame was produced in the same manner as in Example 1, except that the anodized film (alumite) was formed so as to have a film thickness of 1.5 µm. The anodized film was subjected to coloring; however, the color was slightly pale (pale dark brown), and the pellicle frame had an L value of 39. In addition, a transmittance of the transparent polymer electrodeposition coating film in a visible light region as measured in the same manner as in Example 1 was 82%.

Similarly, ten pellicle frames were produced and subjected to appearance inspection. As a result, in all of the frames, neither color unevenness observed in the case where a transparent polymer electrodeposition coating film is heterogeneous nor surface abnormality observed in the case where a transparent polymer electrodeposition coating film is not formed was perceived.

The inside face of the frame of a pellicle produced in the same manner as in Example 1 was irradiated with an ArF laser set to 5 mJ/cm$^2$/pulse and 500 Hz. After elapsing 30 minutes after carrying out the irradiation with an ArF laser (integrated energy: 4,500 J), the state of the inside face of the frame was inspected in a dark room upon irradiation with a light-condensing lamp. As a result, a glare to be caused due to particles was not observed.

At this time, the color of the pellicle frame was pale, and the brightness was high. Therefore, when irradiating the light-condensing lamp, the frame was brightly lit, and as compared with Example 1, a time of 1.8 times was required for the inspection of the ten pellicle frames.

Using another pellicle produced in the same manner, an ion analysis was performed. The pellicle was immersed in 100 mL of pure water at 90° C. for 3 hours, and then, the water in which the pellicle was immersed was subjected to an ion analysis. As a result, a sulfate ion was not detected.

Comparative Example 2

A pellicle frame was produced in the same manner as in Example 1, except that the anodized film (alumite) was formed so as to have a film thickness of 10.0 µm. The anodized film was colored black, and the pellicle frame had an L value of 22. In addition, a transmittance of the transparent polymer electrodeposition coating film in a visible light region as measured in the same manner as in Example 1 was 83%.

Similarly, ten pellicle frames were produced and subjected to appearance inspection. As a result, in the seven frames, color unevenness observed in the case where a transparent polymer electrodeposition coating film is heterogeneous, or surface abnormality observed in the case where a transparent polymer electrodeposition coating film is not formed was perceived.

Using the pellicle frames in which neither color unevenness nor surface abnormality was observed, the inside face of the frame was irradiated with an ArF laser set to 5 mJ/cm$^2$/pulse and 500 Hz in the same manner as in Example 1. After elapsing 30 minutes after carrying out the irradiation with an ArF laser (integrated energy: 4,500 J), the state of the inside face of the frame was inspected in a dark room upon irradiation with a light-condensing lamp. As a result, a glare to be caused due to particles was not observed.

Using another pellicle produced in the same manner, an ion analysis was performed. The pellicle was immersed in 100 mL of pure water at 90° C. for 3 hours, and then, the water in which the pellicle was immersed was subjected to an ion analysis. As a result, a sulfate ion was not detected.

Comparative Example 3

A pellicle frame was produced in the same manner as in Example 1, except that the anodized film (alumite) was formed so as to have a film thickness of 8.0 µm. The anodized film was colored black, and the pellicle frame had an L value of 23. In addition, a transmittance of the transparent polymer electrodeposition coating film in a visible light region as measured in the same manner as in Example 1 was 82%.

Similarly, ten pellicle frames were produced and subjected to appearance inspection. As a result, in the five frames, color unevenness observed in the case where a transparent polymer electrodeposition coating film is heterogeneous, or surface abnormality observed in the case where a transparent polymer electrodeposition coating film is not formed was perceived.

Using the pellicle frames in which neither color unevenness nor surface abnormality was observed, the inside face of the frame was irradiated with an ArF laser set to 5 mJ/cm$^2$/pulse and 500 Hz in the same manner as in Example 1. After elapsing 30 minutes after carrying out the irradiation with an ArF laser (integrated energy: 4,500 J), the state of the inside face of the frame was inspected in a dark room upon irradiation with a light-condensing lamp. As a result, a glare to be caused due to particles was not observed.

Using another pellicle produced in the same manner, an ion analysis was performed. The pellicle was immersed in 100 mL of pure water at 90° C. for 3 hours, and then, the water in which the pellicle was immersed was subjected to an ion analysis. As a result, a sulfate ion was not detected.

Comparative Example 4

First, an aluminum-made frame having frame external dimensions of 149 mm×115 mm×4.5 mm and a frame thickness of 2 mm was prepared as a pellicle frame base. A surface of this frame base was subjected to sandblasting in the same manner as in Example 1.

Subsequently, an anodized film (alumite) having a film thickness of 6.0 μm was formed on the frame base by adopting the sulfuric acid method as in Example 1. The anodized film was colored black in the same manner as in Example 1, followed by applying a sealing treatment. Thereafter, the frame was washed with pure water, thereby accomplishing a pellicle frame. The thus obtained pellicle frame had an L value of 24.

With respect to the resulting pellicle frame, a pellicle was accomplished in the same manner as in Example 1.

Using the produced pellicle, an ion analysis was performed in the same manner as in Example 1. As a result, a sulfate ion was detected.

Comparative Example 5

First, an aluminum-made frame having frame external dimensions of 149 mm×115 mm×4.5 mm and a frame thickness of 2 mm was prepared as a pellicle frame base.

Subsequently, an electrodeposition coating material (ELECOAT AM, manufactured by Shimizu Co., Ltd.) was mixed with carbon black (a trade name: ELECOAT COLOR BLACK, manufactured by Shimizu Co., Ltd.) in a concentration of 10 g/L and a filler (a trade name: ELECOAT ST Satiner, manufactured by Shimizu Co., Ltd.) in a concentration of 55 g/L, and the frame base was subjected to anionic electrodeposition coating with this mixed coating material in the same manner as in Example 1. According to this, a polymer layer having a thickness of 9 μm was formed. The frame which had been subjected to electrodeposition coating was heated under a condition at 200° C. for 60 minutes to cure the polymer layer. A transmittance of the polymer layer in a visible light region as measured in the same manner as in Example 1 was 1 to 10%. In addition, an L value of the thus obtained pellicle frame was 20 to 25.

Using the resulting pellicle frame, a pellicle was accomplished in the same manner as in Example 1.

The inside face of the frame of a pellicle produced was irradiated with an ArF laser in the same manner as in Example 1. After elapsing 30 minutes after carrying out the irradiation with an ArF laser (integrated energy: 4,500 J), the state of the inside face of the frame was inspected in a dark room upon irradiation with a light-condensing lamp. As a result, a glare to be caused due to particles was observed.

In the light of the above, in the Examples, not only elution of a sulfate ion is not observed, but also even in the case where a stray light hits the inside face of a pellicle frame, particles are not produced, and contamination of a photomask can be prevented from occurring. In addition, the generation of a surface defect to be mistaken for a foreign material is suppressed, thereby making it easy to undergo an appearance inspection.

REFERENCE SIGNS LIST 1, 101: Pellicle film
2, 102: Pellicle frame
3, 103: Adhesive
4, 104: Pressure sensitive adhesive layer
5, 105: Photomask
6, 106: Pattern region
7: Frame base
8: Anodized film
9: Transparent polymer electrodeposition coating film

The invention claimed is:

1. A pellicle frame comprising a frame base, a black anodized film formed on a surface of the frame base and having a thickness of 2.0 to 7.5 μm, and a transparent polymer electrodeposition coating film formed on the anodized film.

2. The pellicle frame according to claim 1, wherein the transparent polymer electrodeposition coating film does not contain a heterogeneous component existing heterogeneously relative to the transparent polymer electrodeposition coating film.

3. The pellicle frame according to claim 1, wherein the transparent polymer electrodeposition coating film does not contain a dye.

4. The pellicle frame according to claim 1, wherein a visible light transmittance of the transparent polymer electrodeposition coating film is more than 50%.

5. A pellicle comprising the pellicle frame according to claim 1 and a pellicle film provided on one end face of the pellicle frame.

6. A method of producing a pellicle frame, comprising:
a step of forming an anodized film having a thickness of 2.0 to 7.5 μm on a surface of a frame base;
a step of coloring the anodized film black; and
a step of forming a transparent polymer electrodeposition coating film on the anodized film, in this order.

* * * * *